(12) United States Patent
Kim

(10) Patent No.: US 8,995,205 B2
(45) Date of Patent: Mar. 31, 2015

(54) SEMICONDUCTOR MEMORY DEVICE AND METHOD OF TESTING THE SAME

(71) Applicant: SK Hynix Inc., Gyeonggi-do (KR)

(72) Inventor: Kwang-Hyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 310 days.

(21) Appl. No.: 13/709,895

(22) Filed: Dec. 10, 2012

(65) Prior Publication Data

US 2014/0016416 A1   Jan. 16, 2014

(30) Foreign Application Priority Data

Jul. 16, 2012   (KR) .................. 10-2012-0077200

(51) Int. Cl.
| | | |
|---|---|---|
| G11C 7/00 | (2006.01) | |
| G11C 29/18 | (2006.01) | |
| G11C 7/12 | (2006.01) | |
| G11C 29/12 | (2006.01) | |
| G11C 11/41 | (2006.01) | |
| G11C 29/26 | (2006.01) | |

(52) U.S. Cl.
CPC *G11C 29/18* (2013.01); *G11C 7/12* (2013.01); *G11C 11/41* (2013.01); *G11C 29/1201* (2013.01); *G11C 2029/2602* (2013.01)

USPC ............ 365/189.04; 365/189.15; 365/189.16; 365/201

(58) Field of Classification Search
CPC ............................ G11C 7/22; G11C 7/10757
USPC .................. 365/189.04, 189.15, 189.16, 201
See application file for complete search history.

(56) References Cited

U.S. PATENT DOCUMENTS

| | | | | |
|---|---|---|---|---|
| 5,265,100 | A * | 11/1993 | McClure et al. ............... | 714/719 |
| 6,408,411 | B1 * | 6/2002 | Brown et al. .................. | 714/724 |
| 6,546,510 | B1 * | 4/2003 | Mazumder et al. ........... | 714/718 |
| 7,046,563 | B1 | 5/2006 | Kim | |

* cited by examiner

*Primary Examiner* — Son Dinh
(74) *Attorney, Agent, or Firm* — IP & T Group LLP

(57) ABSTRACT

Provided is a semiconductor memory device in which a plurality of first and second data lines coupled to a memory cell array are alternately arranged. The semiconductor memory device includes a first write driving circuit configured to load a plurality of first write data transmitted through a plurality of third data lines into the plurality of first data lines in response to a first write enable signal; a second write driving circuit configured to load a plurality of second write data transmitted through a plurality of fourth data lines into the plurality of second data lines in response to a second write enable signal; and a column control circuit configured to activate at least one of the first and second write enable signals during a given period, in response to a plurality of data width option modes, during a parallel test mode.

17 Claims, 7 Drawing Sheets

US 8,995,205 B2

SEMICONDUCTOR MEMORY DEVICE AND METHOD OF TESTING THE SAME

CROSS-REFERENCE TO RELATED APPLICATIONS

The present application claims priority of Korean Patent Application No. 10-2012-0077200, filed on Jul. 16, 2012, which is incorporated herein by reference in its entirety.

BACKGROUND

1. Field

Exemplary embodiments of the present invention relate to a semiconductor design technology, and more particularly, to a multi-bit parallel test of semiconductor memory device.

2. Description of the Related Art

In general, a semiconductor memory device such as DRAM supports a variety of test items, and a variety of tests are performed at a wafer level and a package level to reduce the manufacturing cost and improve the yield. In particular, a multi-bit parallel test (hereafter, referred to as a parallel test) is an important test for reducing the test time and is performed at both a wafer level and a package level.

In the technology for testing a semiconductor memory device, it is not only important to perform a reliable test, but also it is essential to perform a test at a high speed. In particular, whether the development time and the test time of a semiconductor memory device can be reduced or not has an effect on a manufacturing cost. Therefore, the reduction of the test time has become an important issue in the efficiency of production and the competition between makers. In the conventional semiconductor memory device, a test was performed for each memory cell to determine whether the memory cell is passed or failed at a wafer level and a package level. Therefore, with the high integration of the semiconductor memory device, the test time has proportionally increased. Accordingly, the parallel test has been introduced to reduce the test time.

The operation of the parallel test will be briefly described. First, the same data are written into a plurality of cells, and an exclusive OR gate is then used to read the data during a read operation. When the same data are read from the plurality of cells, '1' is outputted to make a pass decision, and when different data is read from any one of the plurality of cells, '0' is outputted to make a fail decision. In such a parallel test, the test is not performed for each memory cell, but a large number of banks are simultaneously enabled at a time to perform a write/read operation of data. Therefore, it may be possible to reduce the test time.

Recently, the arrangement of segment input/output (SIO) lines has been achieved by considering optimization for the architecture or layout of memory cell arrays, bit line sense amplifiers (BLSA), bit lines and the like. In other words, a plurality of write data provided from different write driving circuits are alternately loaded into a plurality of segment input/output lines.

FIG. 1 is a block diagram illustrating a conventional semiconductor memory device.

Referring to FIG. 1, a plurality of first segment input/output lines SIO0 to SIO3 and a plurality of second segment input/output lines SIO4 to SIO7, coupled to a memory cell array area CA, are alternately arranged. Furthermore, the plurality of first segment input/output lines SIO0 to SIO3 are connected to a first write driving circuit 10 through a plurality of first local input/output lines LIO0 to LIO3, and the plurality of second segment input/output lines SIO4 to SIO7 are connected to a second write driving circuit 20 through a plurality of second local input/output lines LIO4 to LIO7.

Here, the first write driving circuit 10 loads a plurality of first write data loaded in a plurality of first global input/output lines GIO<0:3> into the plurality of first local input/output lines LIO0 to LIO3 in response to a first write enable signal BWEN03. The second write driving circuit 20 loads a plurality of second write data loaded in a plurality of second global input/output lines GIO<4:7> into the plurality of second local input/output lines LIO4 to LIO7 in response to a second write enable signal BWEN47. At this time, the first and second write driving circuit 10 and 20 are selectively enabled based on a data width option mode X8 or X4. For example, any one of the first and second write driving circuits 10 and 20 is enabled in the X4 mode, and both of the first and second write driving circuits 10 and 20 are enabled in the X8 mode.

However, the semiconductor memory device having the above-described configuration has the following concerns during the parallel test mode.

The parallel test mode is performed in response to a data width option mode having a maximum data width among the data width option modes supported by the semiconductor memory device. For example, when the X8 mode and the X4 mode are supported as the data width option modes, the parallel test mode is performed under the condition of the X8 mode.

However, since the first and second write driving circuits 10 and 20 are controlled to be enabled based on the data width option mode X8 or X4 during a write operation, and the write operation is performed in a different environment condition depending on the data width option mode X8 or X4. In the X4 mode, only the first write driving circuit 10 is enabled to load the plurality of first write data loaded in the plurality of first global input/output lines GIO<0:3> into the plurality of first local input/output lines LIO0 to LIO3, and the plurality of first write data are finally written into the memory cell array CA through the plurality of first segment input/output lines SIO0 to SIO3 connected to the plurality of first local input/output lines LIO0 to LIO3. At this time, since a column select signal YI is activated, charge sharing occurs in the plurality of second segment input/output lines SIO4 to SIO7 connected to the disabled second write driving circuit 20. In such a case, as the plurality of first write data are driven to the plurality of first segment input/output lines SIO0 to SIO3 as illustrated in FIG. 2, the plurality of first write data may have a coupling effect on an arbitrary second segment input/output line (for example, SIO6). In a serious case, amplified data of a BLSA (not illustrated) may be inverted to cause a read failure.

Therefore, the conventional semiconductor memory device does not reflect a coupling effect, which occurs in an arbitrary segment input/output line (for example, SIO6) in a specific data width option mode (for example, X4 mode), during the parallel test mode. Therefore, the screen ability of the semiconductor memory device may decrease.

SUMMARY

Exemplary embodiments of the present invention are directed to a semiconductor memory device capable of supporting a plurality of data width option modes including a data width option mode having a maximum data width during a parallel test mode, and a method of testing the same.

In accordance with an embodiment of the present invention, a semiconductor memory device includes a plurality of first and second data lines configured to be coupled to a memory cell array, both lines are alternately arranged, a first write driving circuit configured to load a plurality of first write data transmitted through a plurality of third data lines into the plurality of first data lines in response to a first write enable signal, a second write driving circuit configured to load a plurality of second write data transmitted through a plurality of fourth data lines into the plurality of second data lines in response to a second write enable signal, and a column control circuit configured to activate at least one of the first and second write enable signals during a given period, in response to a plurality of data width option modes, during a parallel test mode.

In accordance with another embodiment of the present invention, there is provided a method of testing a semiconductor memory device in which a plurality of first and second data lines coupled to a memory cell array are alternately arranged. The method includes entering a parallel test mode to support a plurality of data width option modes and entering a given first data width option mode, activating, by a column control circuit, a first write enable signal during a first period in response to a given column address, loading, by a first write driving circuit, a plurality of first write data transmitted through a plurality of third data lines into the plurality of first data lines, in response to the first write enable signal, activating, by the column control circuit, a second write enable signal during a second period in response to the column address, and loading, by a second write driving circuit, a plurality of second write data transmitted through a plurality of fourth data lines into the plurality of second data lines, in response to the second write enable signal.

In accordance with yet another embodiment of the present invention, a method of testing a semiconductor memory device includes entering a parallel test mode, sequentially transmitting a plurality of write data through a plurality of write paths, respectively, and storing the write data in a memory cell array, based on a first data width option mode, reading a plurality of read data corresponding to the write data stored in the memory cell array through a plurality of read paths corresponding to the respective write paths at the same time based on a second data width option mode, and compressing the plurality of read data, and outputting the compressed data to the outside.

DETAILED DESCRIPTION

Figure 1:
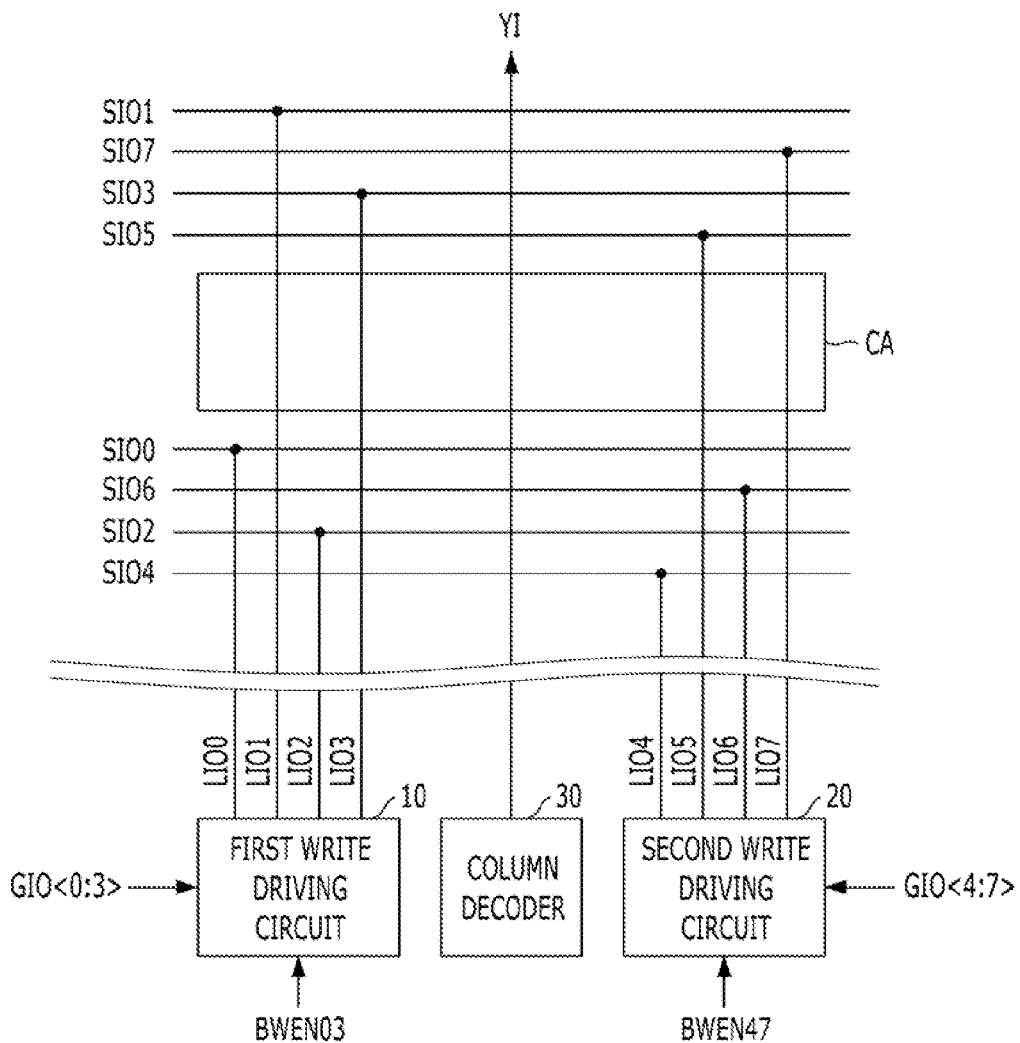
FIG. 1 is a block diagram illustrating a conventional semiconductor memory device.
Figure 2:
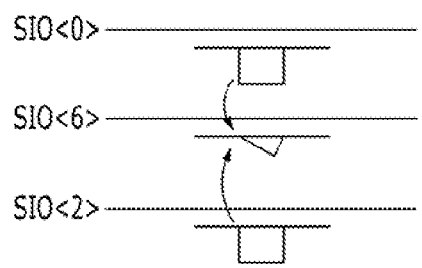
FIG. 2 is a timing diagram illustrating operations of the semiconductor memory device shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the embodiments of the present invention, suppose that the X8 mode in which data are inputted/outputted through eight data pads and the X4 mode in which data are inputted/outputted through four data pads are supported as data width option modes.

Figure 5:
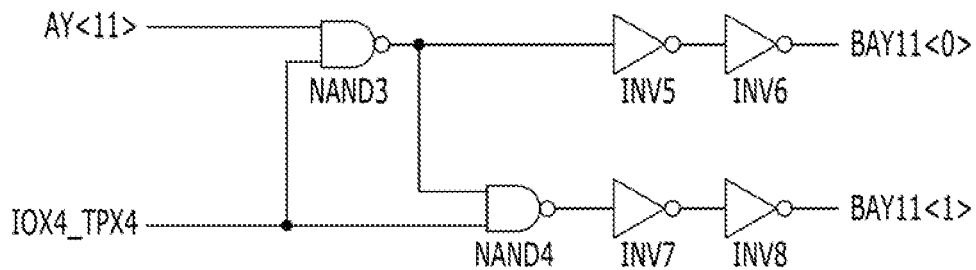
FIG. 5 is a detailed circuit diagram of a column address control unit shown in FIG. 3.
Figure 6:
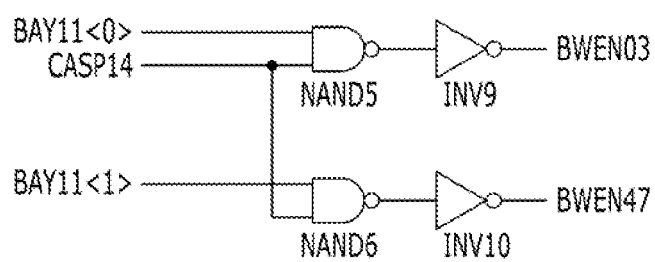
FIG. 6 is a detailed circuit diagram of a write driving control unit shown in FIG. 3.
Figure 7:
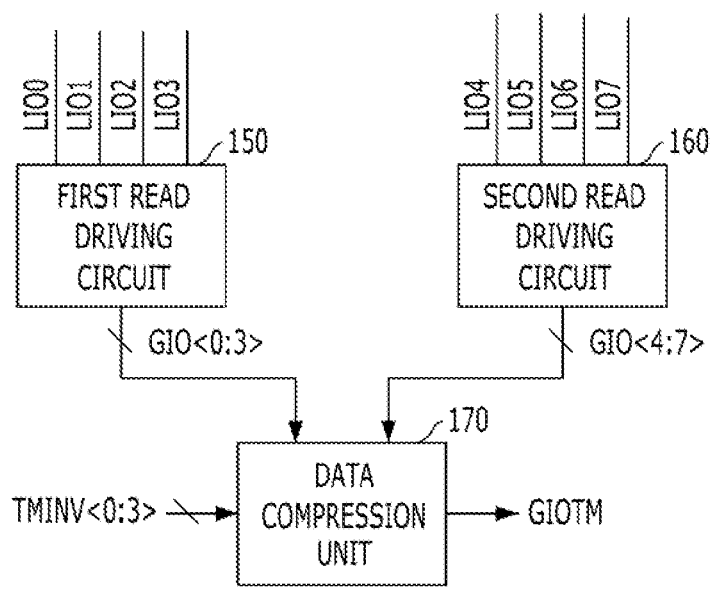
FIG. 7 is a block diagram illustrating a read path during a parallel test in the semiconductor memory device in accordance with an embodiment of the present invention.
Figure 8:
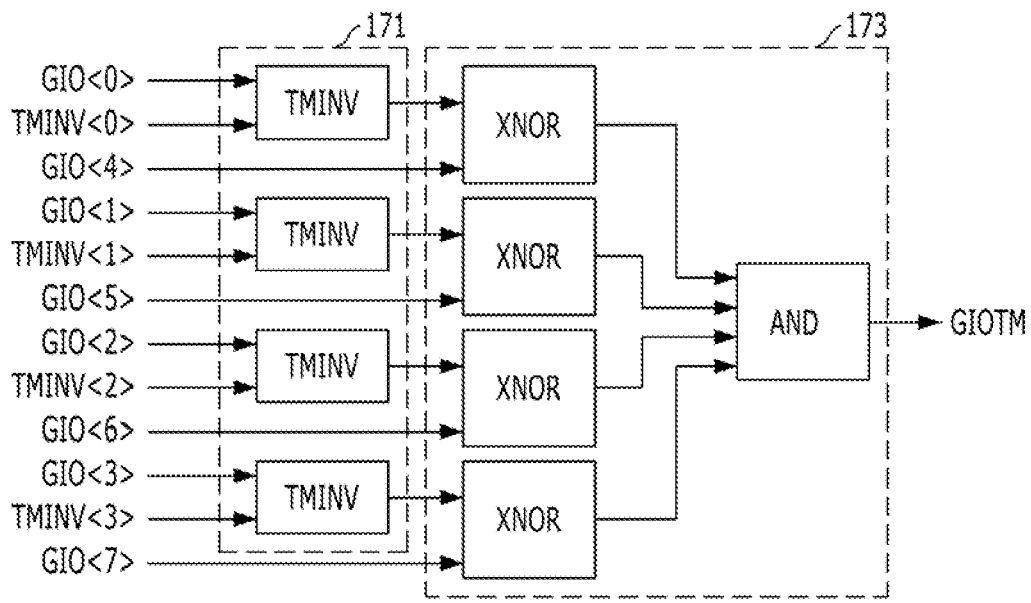
FIG. 8 is a detailed diagram of a data compression unit shown in FIG. 7.
Figure 9:
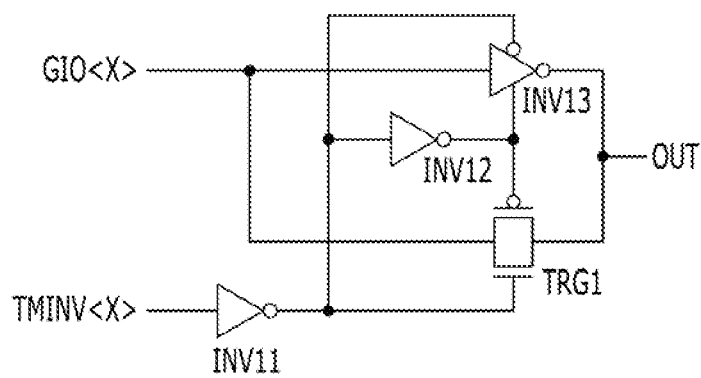
FIG. 9 is a detailed circuit diagram of a test-mode inversion unit shown in FIG. 8.

FIGS. 3 to 9 are configuration diagrams of a semiconductor memory device in accordance with an embodiment of the present invention. FIGS. 3 to 6 are configuration diagrams for explaining a write path during a parallel test in the semiconductor memory device in accordance with the embodiment of the present invention. FIGS. 7 to 9 are configuration diagrams for explaining a read path during a parallel test in the semiconductor memory device in accordance with the embodiment of the present invention.

First, the write path of the semiconductor memory device in accordance with the embodiment of the present invention will be described.

Figure 3:
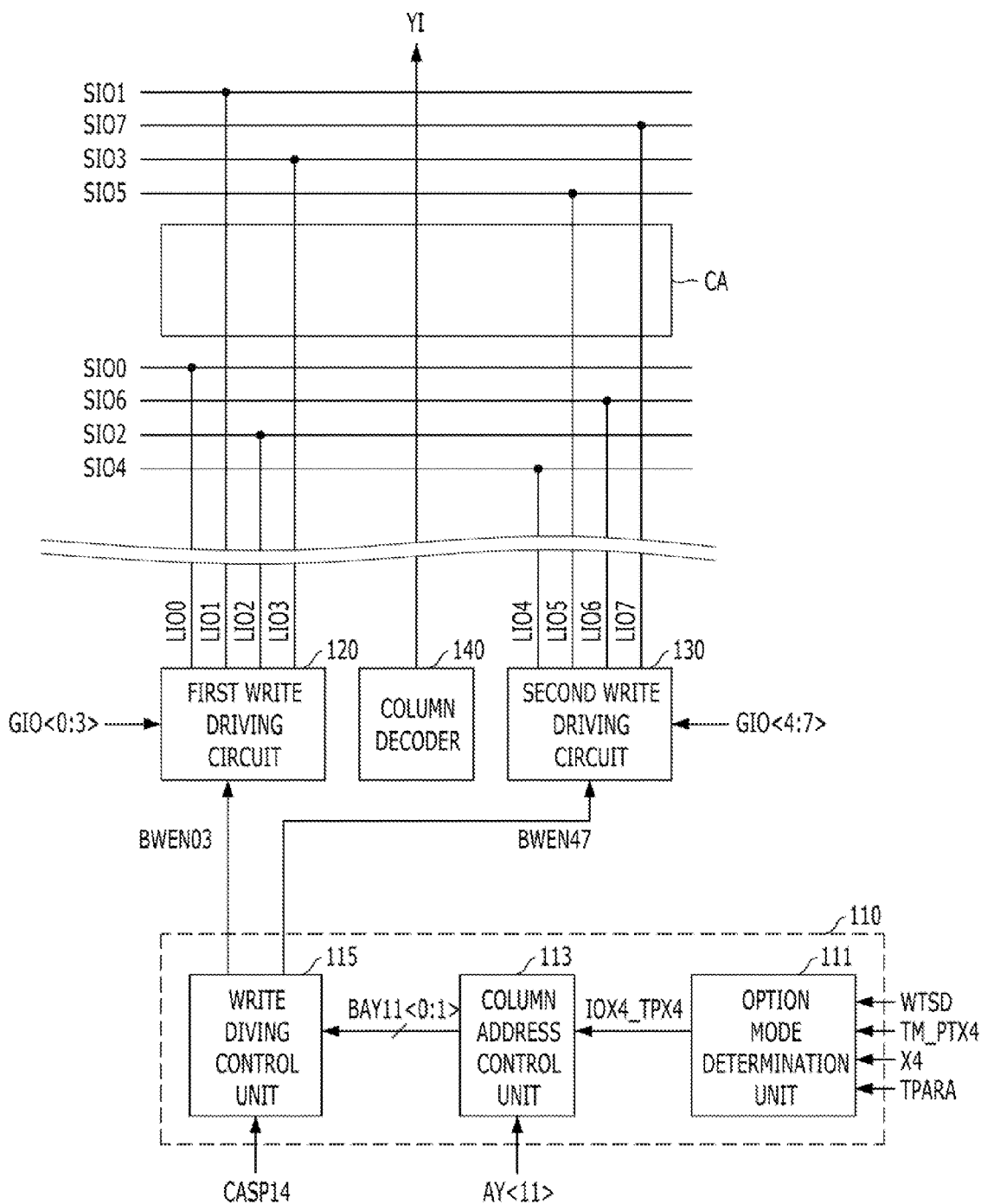
FIG. 3 is a block diagram illustrating a write path during a parallel test in a semiconductor memory device in accordance with an embodiment of the present invention.
Figure 4:
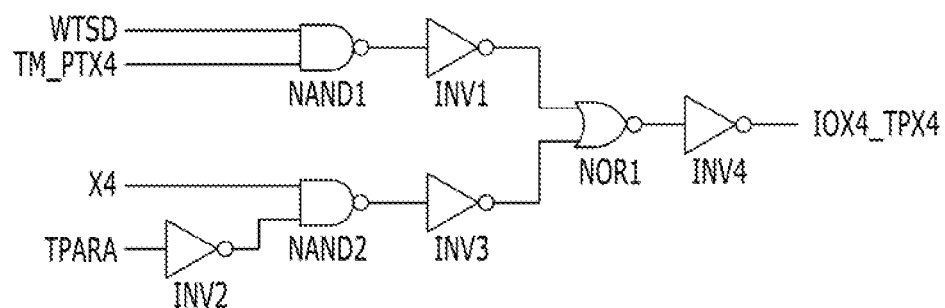
FIG. 4 is a detailed circuit diagram of an option mode determination unit shown in FIG. 3.

FIG. 3 is a block diagram illustrating a write path during a parallel test in the semiconductor memory device in accordance with the embodiment of the present invention. FIG. 4 is a detailed circuit diagram of an option mode determination unit 111 shown in FIG. 3. FIG. 5 is a detailed circuit diagram of a column address control unit 113 shown in FIG. 3. FIG. 6 is a detailed circuit diagram of a write driving control unit 115 shown in FIG. 3.

Referring to FIG. 3, the semiconductor memory device includes a column control circuit 110, a first write driving circuit 120, a second write driving circuit 130, a plurality of first segment input/output lines SIO0 to SIO3, and a plurality of second segment input/output lines SIO4 to SIO7. The column control circuit 110 is configured to activate at least one of first and second write enable signals BWEN03 and BWEN47 for a given period in response to a plurality of data width option modes X8/X4. The first write driving circuit 120 is configured to load a plurality of first write data transmitted through a plurality of first global input/output lines GIO<0:3> into a plurality of first local input/output lines LIO0 to LIO3 in response to the first write enable signal BWEN03. The second write driving circuit 130 is configured to load a plurality of second write data transmitted through a plurality of second global input/output lines GIO<4:7> into a plurality of second local input/output lines LIO4 to LIO7 in response to the second write enable signal BWEN47. The plurality of first segment input/output lines SIO0 to SIO3 are connected between the first local input/output lines LIO0 to LIO3 and a memory cell array CA. The plurality of second segment input/output lines SIO4 to SIO7 are connected between the second local input/output lines LIO4 to LIO7 and the memory cell array CA. At this time, the first and second segment input/output lines SIO0 to SIO3 and SIO4 to SIO7 are alternately arranged, and connected to the memory cell array CA based on the column select signal YI generated from the column decoder 140.

Meanwhile, the column control circuit 110 includes an option mode determination unit 111, a column address control unit 113, and a write driving control unit 115. The option mode determination unit 111 is configured to generate an option mode determination signal IOX4_TPX4 in response to a write mode signal WTSD, a test-mode data width option mode signal TM_PTX4, a normal-mode data width option mode signal X4, and a parallel test mode signal TPARA. The column address control unit 113 is configured to generate first and second column control signals BAY11<0:1> corresponding to a given column address AY<11> in response to the option mode determination signal IOX4_TPX4. The write driving control unit 115 is configured to generate the first and second write enable signals BWEN03 and BWEN47 in response to the first and second column control signals BAY11<0:1> and a write pulse CASP14, which is a signal obtained by delaying an internal write command WT by a given period.

Referring to FIG. 4, the option mode determination unit 111 includes a first NAND gate NAND1, a first inverter INV1, a second inverter INV2, a second NAND gate NAND2, a third inverter INV3, a first NOR gate NOR1, and a fourth inverter INV4. The first NAND gate NAND1 performs a NAND operation on the write mode signal WTSD and the test-mode data width option mode signal TM_PTX4. The first inverter INV1 inverts an output signal of the first NAND gate NAND1. The second inverter INV2 inverts the parallel test mode signal TPARA. The second NAND gate NAND2 performs a NAND operation on an output signal of the second inverter INV2 and the normal-mode data width option mode signal X4. The third inverter INV3 inverts an output signal of the second NAND gate NAND2. The first NOR gate NOR1 performs a NOR operation on output signals of the first and third inverters INV1 and INV3. The fourth inverter INV4 inverts an output signal of the first NOR gate NOR1 to output the option mode determination signal IOX4_TPX4. Referring to Table 1, the option mode determination unit 111 having the above-described configuration activates the option mode determination signal IOX4_TPX4 to a logic high level when the test-mode data width option mode signal TM_PTX4 and the write mode signal WTSD are activated to a logic high level, regardless of the other signals X4 and TPARA. Such a case corresponds to a case in which the semiconductor memory device operates in the X4 mode during the parallel test mode, and is applied only during a write mode. On the other hand, the option mode determination unit 111 activates the option mode determination signal IOX4_TPX4 to a logic high level when the normal-mode data width option mode signal X4 is activated to a logic high level and the parallel test mode signal TPARA is deactivated to a logic low level, regardless of the other signals TM_PTX4 and WTSD. Such a case corresponds to a case in which the semiconductor memory device operates in the X4 mode during a normal mode. Meanwhile, when the option mode determination signal IOX4_TPX4 is deactivated to a logic low level based on a logic combination of the write mode signal WTSD, the test-mode data width option mode signal TM_PTX4, the normal-mode data width option mode signal X4, and the parallel test mode signal TPARA, the semiconductor memory device operates in the X8 mode during the parallel test mode or the normal mode.

TABLE 1

| X4 | TPARA | TM_PTX4 | WTSD | IOX4_TPX4 | Operation |
|----|-------|---------|------|-----------|-----------|
| X  | X     | H       | H    | H         | Test X4 (Write) |
| H  | L     | X       | X    | H         | Normal X4 |
|    |       | Other cases |  | L         | Test X8 or Normal X8 |

Referring to FIG. 5, the column address control unit 113 includes a third NAND gate NAND3, a fifth inverter INV5, a sixth inverter INV6, a fourth NAND gate NAND4, a seventh inverter INV7, and an eighth inverter INV8. The third NAND gate NAND3 performs a NAND operation on the column address AY<11> and the option mode determination signal IOX4_TPX4. The fifth inverter INV5 inverts an output signal of the third NAND gate NAND3. The sixth inverter INV6 inverts an output signal of the fifth inverter INV5 to output the first column control signal BAY11<0>. The fourth NAND gate NAND4 performs a NAND operation on an output signal of the third NAND gate NAND3 and the option mode determination signal IOX4_TPX4. The seventh inverter INV7 inverts an output signal of the fourth NAND gate NAND4. The eighth inverter INV8 inverts an output signal of the seventh inverter INV7 to output the second column control signal BAY11<1>. The column address control unit 113 having the above-described configuration selectively activates the first and second column control signals BAY11<0:1> in response to the column address AY<11> when the option mode determination signal IOX4_TPX4 is activated to a logic high level, and activates the first and second column control signals BAY11<0:1> to a logic high level when the option mode determination signal IOX4_TPX4 is deactivated to a logic low level, regardless of the column address AY<11>.

Referring to FIG. 6, the write driving control unit 115 includes a fifth NAND gate NAND5, a ninth inverter INV9, a sixth NAND gate NAND6, and a tenth inverter INV10. The fifth NAND gate NAND5 performs a NAND operation on the first column control signal BAY11<0> and the write pulse CASP14. The ninth inverter INV9 inverts an output signal of the fifth NAND gate NAND5 to output the first write enable signal BWEN03. The sixth NAND gate NAND6 performs a NAND operation on the second column control signal BAY11<1> and the write pulse CASP14. The tenth inverter INV10 inverts an output signal of the sixth NAND gate NAND6 to output the second write enable signal BWEN47. The write driving control unit 115 having the above-described configuration activates the first and second write enable signals BWEN03 and BWEN47 in response to the write pulse CASP14 when the first and second column control signals BAY11<0:1> are activated to a logic high level.

Next, a read path of the semiconductor memory device in accordance with the embodiment of the present invention will be described.

FIG. 7 is a block diagram illustrating a read path during a parallel test in the semiconductor memory device in accordance with the embodiment of the present invention. FIG. 8 is a detailed diagram of a data compression unit shown in FIG. 7.

Referring to FIG. 7, the semiconductor memory device includes a first read driving circuit 150, a second read driving circuit 160, and a data compression unit 170. The first read driving circuit 150 is configured to receive a plurality of first read data from the memory cell array CA through the plurality of first segment input/output lines SIO0 to SIO3 and the plurality of first local input/output lines LIO0 to LIO3, and drive the plurality of first global input/output lines GIO<0:3>. The second read driving circuit 160 is configured to receive a plurality of second read data from the memory cell array CA through the plurality of second segment input/output lines SIO4 to SIO7 and the plurality of second local input/output lines LIO4 to LIO7, and drive the plurality of second global input/output lines GIO<4:7>. The data compression unit 170 is configured to compress the plurality of first and second read data loaded in the plurality of first and second global input/output lines GIO<0:3> and GIO<4:7> in response to a plurality of read test mode signals TMINV<0:3> during the parallel test mode, and output the compressed data GIOTM to the outside.

Here, the first and second read driving circuit 150 and 160 refer to input/output sense amplifiers (IOSA). Since the IOSA is well known to those skilled in the art, the detailed descriptions thereof are omitted herein.

Referring to FIG. 8, the data compression unit 170 includes a test-mode inversion unit 171 and a logic operation unit 173. The test-mode inversion unit 171 is configured to non-invert or invert the plurality of first read data loaded in the plurality of first global input/output lines GIO<0:3> in response to the plurality of read test mode signals TMINV<0:3>. The logic operation unit 173 is configured to perform a logic operation on the plurality of first read data outputted from the test-mode inversion unit 171 and the plurality of second read data loaded in the plurality of second global input/output lines GIO<4:7>.

signals TMINV<0:3> are activated to a logic high level, and non-inverts and outputs the plurality of first read data loaded in the plurality of first global input/output lines when the plurality of read test mode signals TMINV<0:3> are deactivated to a logic low level. This is to equalize the logic levels of the first and second read data inputted to the logic operation unit 173 based on the logic level relation between the first and second read data. For reference, in the embodiment of the present invention, the first and second write data are written in different periods based on the X4 mode during the parallel test mode. At this time, the first and second write data may be written at different logic levels. Therefore, when the first and second read data corresponding to the first and second write data are read, the read data having different logic levels need to be equalized in consideration of compression operation characteristics. For example, referring to Table 2, when the logic levels of the first and second write data GIO<0> and GIO<4>, GIO<1> and GIO<5>, GIO<2> and GIO<6>, and GIO<3> and GIO<7>, respectively, on which a NOR operation is performed are different from each other (TPH OF), all of the first read data are inverted, and when only the first and second write data GIO<0> and GIO<4> and GIO<1> and GIO<5> among the plurality of first and second write data have different levels from each other (TPH 03), only the corresponding first read data GIO<0:1> are inverted. Meanwhile, when the logic levels of the first and second write data GIO<0> and GIO<4>, GIO<1> and GIO<5>, GIO<2> and GIO<6>, and GIO<3> and GIO<7>, respectively, are equal to each other (TPH33), the plurality of first read data are non-inverted.

TABLE 2

| Operation | Write | | | | | | | Read | | | | | | | | TM application |
|---|---|---|---|---|---|---|---|---|---|---|---|---|---|---|---|---|
| GIO | 0 | 6 | 2 | 4 | 1 | 7 | 3 | 5 | 0 | 6 | 2 | 4 | 1 | 7 | 3 | 5 | |
| TPH OF | 1 | 0 | 1 | 0 | 1 | 0 | 1 | 0 | 0 | 0 | 0 | 0 | 0 | 0 | 0 | 0 | GIO<0:3> all TM applied |
| TPH 33 | 1 | 0 | 0 | 1 | 1 | 0 | 0 | 1 | 1 | 0 | 0 | 1 | 1 | 0 | 0 | 1 | TM not applied |
| TPH 03 | 1 | 0 | 0 | 0 | 1 | 0 | 0 | 0 | 0 | 0 | 0 | 0 | 0 | 0 | 0 | 0 | GIO<0:1> TM applied |

The logic operation unit 173 is then configured to output compressed data GIOTM corresponding to the logic operation result to the outside.

The test-mode inversion unit 171 includes a plurality of inversion sections TMINV one-to-one corresponding to the plurality of first global input/output lines GIO<0:3>. Each of the inversion sections TMINV has the same configuration as illustrated in FIG. 9. Referring to FIG. 9, the inversion section TMINV includes an eleventh inverter INV11, a twelfth inverter INV12, a thirteenth inverter INV13, and a first transmission gate TRG1. The eleventh inverter INV11 inverts a corresponding read test mode signal TMINV<X>. The twelfth inverter INV12 inverts an output signal of the eleventh inverter INV11. The thirteenth inverter INV13 inverts read data loaded in a corresponding global input/output line GIO<X> to output the inverted read data, in response to the output signals of the eleventh and twelfth inverters INV11 and INV12. The first transmission gate TRG1 transfers the read data loaded in the global input/output line GIO<X> to output the non-inverted read data, in response to the output signals of the eleventh and twelfth inverters INV11 and INV12. The test-mode inversion unit 171 having the above-described configuration inverts and outputs the plurality of first read data loaded in the plurality of first global input/output lines GIO<0:3> when the plurality of read test mode Referring to FIG. 8, the logic operation unit 173 includes a plurality of exclusive NOR (XNOR) gates XNOR and an AND gate AND. The plurality of XNOR gates XNOR are configured to perform an XNOR operation on the first read data outputted through the test-mode inversion unit 171 and the second read data transmitted through the respective second global input/output lines GIO<4:7>. The AND gate AND is configured to perform an AND operation on output signals of the plurality of XNOR gates XNOR and output the compressed data GIOTM.

Hereafter, a method of testing the semiconductor memory device in accordance with the embodiment of the present invention will be described with reference to FIGS. 10 to 12.

Figure 10:
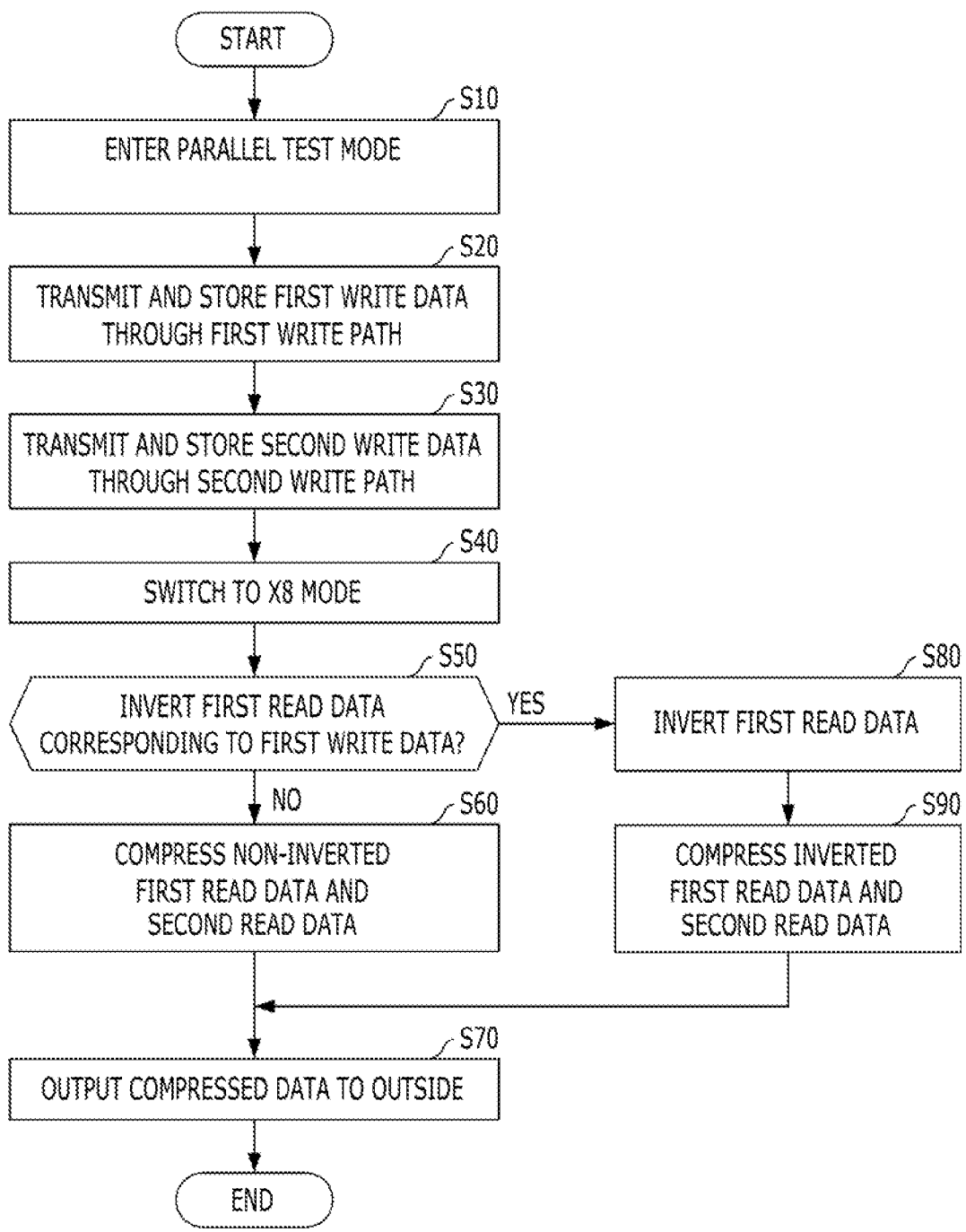
FIG. 10 is a flow chart illustrating a method of testing the semiconductor memory device in accordance with the embodiment of the present invention.

FIG. 10 is a flow chart illustrating the method of testing the semiconductor memory device in accordance with the embodiment of the present invention.

Referring to FIG. 10, the method of testing the semiconductor memory device includes the steps of entering the parallel test mode to support the plurality of data width option modes X8/X4 and entering the X4 mode (S10), writing a plurality of first write data having a first logic level into the memory cell array CA (S20), writing a plurality of second write data having a second logic level into the memory cell array CA (S30), switching to the X8 mode (S40), determining whether or not to invert first read data based on the logic levels of the first and second read data corresponding to the first and second write data (S50), reading the plurality of first and second read data from the memory cell array CA at the same time, non-inverting or inverting the plurality of first read data, and compressing the plurality of second read data and the plurality of non-inverted or inverted first read data (S60, S80, and S90), and outputting the compressed data to the outside (S70).

In other words, the method of testing the semiconductor memory device is performed as follows: the plurality of first write data transmitted through a plurality of first write paths GIO<0:3>, LIO0 to LIO3, and SIO0 to SIO3 are written into the memory cell array CA according to the X4 mode, the plurality of second write data transmitted through a plurality of second write paths GIO<4:7>, LIO4 to LIO7, and SIO4 to SIO7 are written into the memory cell array CA, and the plurality of first and second read data corresponding to the plurality of first and second write data are read from the memory cell array CA at a time according to the X8 mode, and then compressed to be outputted to the outside. The method of testing the semiconductor memory device will be described in more detail.

When the parallel test mode signal TPARA, the test-mode data width option mode signal TM_PTX4, and the write mode signal WTSD are activated at step S10, the option mode determination unit 111 activates the option mode determination signal IOX4_TPX4. As the option mode determination signal IOX4_TPX4 is activated, a write process based on the X4 mode is performed during the parallel test mode. The write process will be described with reference to FIG. 11.

Figure 11:
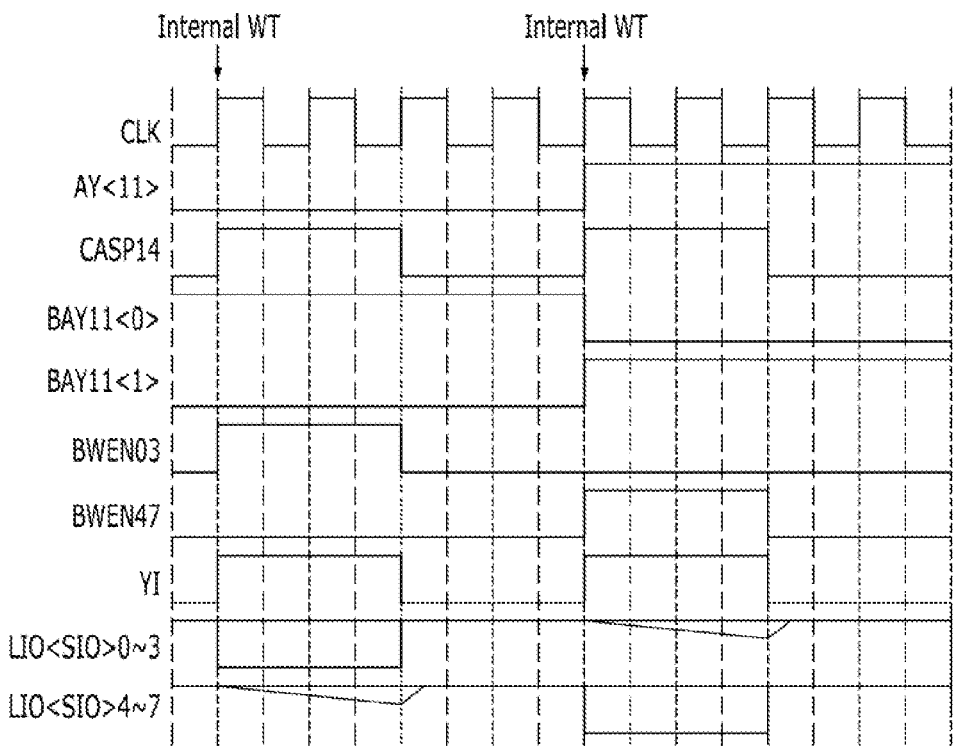
FIG. 11 is a timing diagram illustrating a write operation based on the X4 mode in the method of testing the semiconductor memory device in accordance with the embodiment of the present invention.

FIG. 11 is a timing diagram illustrating the write operation based on the X4 mode.

Referring to FIG. 11, as the option mode determination signal IOX4_TPX4 is activated to a logic high level, the column address control unit 113 selectively activates the first and second column control signals BAY11<0:1> to a logic high level in response to the column address AY<11>. Furthermore, as the first and second column control signals BAY11<0:1> are selectively activated, the write driving control unit 115 selectively activates the first and second write enable signals BWEN03 and BWEN47 in response to the write pulse CASP14. That is, as the first column control signal BAY11<0> is activated during a first period, the write driving control unit 115 activates the first write enable signal BWEN03 in response to a first pulse of the write pulse CASP14, and as the second column control signal BAY11<1> is activated during a second period, the driving control unit 115 activates the second write enable signal BWEN47 in response to a second pulse of the write pulse CASP14.

First, as the first write enable signal BWEN03 is activated, the first write driving circuit 120 loads the plurality of first write data loaded in the plurality of first global input/output lines GIO<0:3> into the plurality of first local input/output lines LIO0 to LIO3. Then, the plurality of first write data are finally written into the memory cell array CA through the plurality of first segment input/output lines SIO0 to SIO3 connected to the plurality of first local input/output lines LIO0 to LIO3. At this time, since the column select signal YI is activated, charge sharing occurs in the plurality of second segment input/output lines SIO4 to SIO7 connected to the disabled second write driving circuit 130. In such a case, as the plurality of first write data are driven to the plurality of first segment input/output lines SIO0 to SIO3 as illustrated in FIG. 11, the plurality of first write data have a coupling effect on the plurality of second segment input/output lines SIO4 to SIO7.

Next, as the second write enable signal BWEN47 is activated, the second write driving circuit 130 loads the plurality of second write data loaded in the plurality of second global input/output lines GIO<4:7> into the plurality of second local input/output lines LIO4 to LIO7. Then, the plurality of second write data are written into the memory cell array CA through the plurality of second segment input/output lines SIO4 to SIO7 connected to the plurality of second local input/output lines LIO4 to LIO7. At this time, since the column select signal YI is activated at the same time, charge sharing occurs in the plurality of first segment input/output lines SIO0 to SIO3 connected to the disabled first write driving circuit 120. In such a case, as the plurality of second write data are driven to the plurality of second segment input/output lines SIO4 to SIO7 as illustrated in FIG. 11, the plurality of second write data have a coupling effect on the plurality of first segment input/output lines SIO0 to SIO3.

Here, the write operation of FIG. 11 is performed in the same manner as a write operation during a normal operation, and performed in the same environment as the write operation during the normal operation. Therefore, the operation characteristic during the normal mode may be reflected as it is. For reference, as the normal-mode data width option mode signal X4 is activated instead of the test-mode data width option mode signal TM_PTX4 during the normal operation, the option mode determination signal IOX4_TPX4 is activated (refer to Table 1).

Continuously, when the first and second write data are written into the memory cell array CA according to the above-described write operation, the normal mode is switched to the X8 mode, and a read process based on the X8 mode is performed. The read process based on the X8 mode is performed as follows.

The plurality of first and second read data corresponding to the first and second write data are simultaneously read from the memory cell array CA and loaded into the plurality of first and second local input/output lines LIO0 to LIO3 and LIO4 to LIO7 through the plurality of first and second segment input/output lines SIO0 to SIO3 and SIO4 to SIO7.

Then, the first read driving circuit 150 loads the plurality of first read data loaded in the plurality of first local input/output lines LIO0 to LIO3 into the plurality of first global input/output lines GIO<0:3>, and the second driving circuit 160 loads the plurality of second read data loaded in the plurality of second local input/output lines LIO4 to LIO7 into the plurality of second global input/output lines GIO<4:7>.

The data compression unit 170 compresses the plurality of first and second read data loaded in the plurality of first and second global input/output lines GIO<0:3> and GIO<4:7> and outputs the compressed data to the outside. The process of compressing the plurality of first and second read data to output to the outside will be described in more detail. The data compression unit 170 non-inverts or inverts the plurality of first read data loaded in the plurality of first global input/output lines GIO<0:3> based on the read test mode signals TMINV<0:3>, performs a logic operation on the plurality of non-inverted or inverted first read data and the plurality of second read data loaded in the plurality of second global input/output lines GIO<4:7>, and outputs the compressed data GIOTM corresponding to the logic operation result to the outside. The logic operation includes an XNOR operation and a NAND operation. Meanwhile, when the first and second write data are written at the same logic level during the above-described write operation, the data compression unit 170 non-inverts the plurality of first read data and performs the compression operation. On the other hand, when the first and second write data are written at different logic levels, the data compression unit 170 inverts the plurality of first read data and performs the compression operation. This is to equalize the logic levels of the first and second read data in consideration of the compression operation characteristic. Furthermore, this is performed to prepare for a case in which the first and second write data are written at different logic levels during the write operation.

When the compressed data GIOTM is generated through the read process based on the X8 mode, it may be possible to check whether or not a read failure occur due to the coupling effect caused during the write process, according to the compressed data GIOTM. Here, the read failure refers to an error in which amplified data of a corresponding BLSA (not illustrated) are inverted by the coupling effect caused during the write process, and thus, wrong data are read during a read operation.

Figure 12:
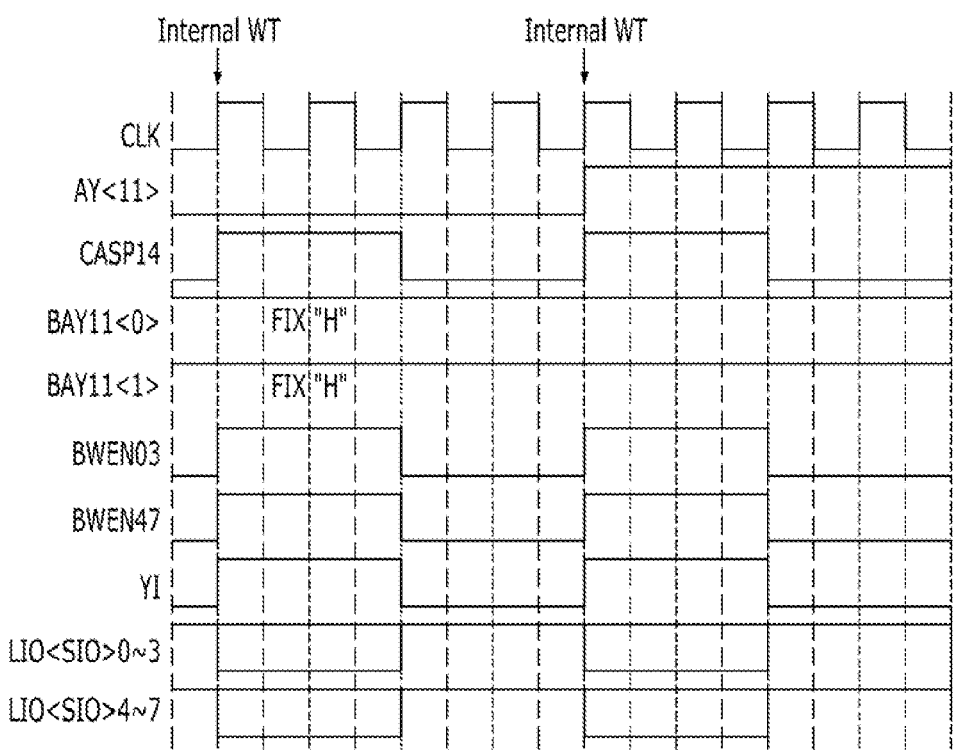
FIG. 12 is a timing diagram illustrating a write operation based on the X8 mode in the method of testing the semiconductor memory device in accordance with the embodiment of the present invention.

FIG. 12 is a timing diagram illustrating a write operation based on the X8 mode.

Referring to FIG. 12, the option mode determination signal IOX4_TPX4 is deactivated to a logic low level in the X8 mode (refer to Table 1). Then, the column address control unit 113 fixes the first and second column control signals BAY11<0:1> to a logic high level regardless of the column address AY<11>. Accordingly, the write driving control unit 115 activates the first and second write enable signals BWEN03 and BWEN47 at the same time, in response to the write pulse CASP14.

As the first and second write enable signals BWEN03 and BWEN47 are activated, the first and second write driving circuits 120 and 130 load the plurality of first and second write data loaded in the plurality of first and second global input/output lines GIO<0:3> and GIO<4:7> into the plurality of first and second local input/output lines LIO0 to LIO3 to LIO4 to LIO7. Then, the plurality of first and second read data are written into the memory cell array CA through the plurality of first and second segment input/output lines SIO0 to SIO3 and SIO4 to SIO7 in response to the column select signal YI.

Then, a read process based on the X8 mode is performed. Since the read process is performed in the same manner as the above-described read process, the detailed descriptions thereof are omitted herein.

In accordance with the embodiments of the present invention, the same condition as the normal operation may be reflected during the parallel test mode. That is, a specific data width option mode (for example, X4 mode) may be supported during the parallel test mode. Therefore, it may be possible to improve the screen ability of the semiconductor memory device.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
  a plurality of first and second data lines configured to be coupled to a memory cell array, both lines are alternately arranged;
  a first write driving circuit configured to load a plurality of first write data transmitted through a plurality of third data lines into the plurality of first data lines in response to a first write enable signal;
  a second write driving circuit configured to load a plurality of second write data transmitted through a plurality of fourth data lines into the plurality of second data lines in response to a second write enable signal; and
  a column control circuit configured to activate at least one of the first and second write enable signals during a given period, in response to a plurality of data width option modes, during a parallel test mode.

2. The semiconductor memory device of claim 1, wherein the column control circuit comprises:
  an option mode determination unit configured to generate an option mode determination signal in response to a write mode signal, a test-mode data width option mode signal, a normal-mode data width option mode signal, and a parallel test mode signal;
  a column address control unit configured to generate a first column control signal and a second column control signal corresponding to a column address in response to the option mode determination signal; and
  a write driving control unit configured to generate the first write enable signal and the second write enable signal in response to the first and second column control signals.

3. The semiconductor memory device of claim 2, wherein when the option mode determination signal is activated, the column address control unit activates the first column control signal and the second column control signal during first and second periods, respectively, in response to the column address.

4. The semiconductor memory device of claim 2, wherein when the option mode determination signal is deactivated, the column address control unit activates the first column control signal and the second column control signal regardless of the column address.

5. The semiconductor memory device of claim 1, further comprising:
  a plurality of fifth data lines electrically connected between the first data line and the first write driving circuit; and
  a plurality of sixth data lines electrically connected between the second data line and the second write driving circuit.

6. The semiconductor memory device of claim 5, wherein the plurality of first and second data lines comprise segment input/output lines,
  the plurality of third and fourth data lines comprise global input/output lines, and
  the plurality of fifth and sixth data lines comprise local input/output lines.

7. The semiconductor memory device of claim 1, further comprising:
  a first read driving circuit configured to load a plurality of first read data read through the plurality of first data lines into the plurality of third data lines;
  a second read driving circuit configured to load a plurality of second read data read through the plurality of second data lines into the plurality of fourth data lines; and
  a data compression unit configured to compress the plurality of first and second read data loaded in the plurality of third and fourth data lines and output the compressed data to the outside, during the parallel test mode.

8. The semiconductor memory device of claim 7, wherein the data compression unit comprises:
  a test-mode inversion unit configured to non-invert or invert the plurality of first read data in response to the read test mode signal; and
  a logic operation unit configured to perform a logic operation on the plurality of first read data outputted from the test-mode inversion unit and the plurality of second read loaded in the plurality of fourth data lines and output compressed data corresponding to the logic operation result to the outside.

9. A method of testing a semiconductor memory device in which a plurality of first and second data lines coupled to a memory cell array are alternately arranged, the method comprising:
- entering a parallel test mode to support a plurality of data width option modes and entering a given first data width option mode;
- activating, by a column control circuit, a first write enable signal during a first period in response to a given column address;
- loading, by a first write driving circuit, a plurality of first write data transmitted through a plurality of third data lines into the plurality of first data lines, in response to the first write enable signal;
- activating, by the column control circuit, a second write enable signal during a second period in response to the column address; and
- loading, by a second write driving circuit, a plurality of second write data transmitted through a plurality of fourth data lines into the plurality of second data lines, in response to the second write enable signal.

10. The method of claim 9, wherein the plurality of first write data have a first logic level, the plurality of second write data have a second logic level, and the first logic level and the second logic level comprise the same logic levels or different logic levels.

11. The method of claim 10, further comprising:
- switching to a given second data width option mode when the plurality of first and second write data loaded in the plurality of first and second data lines are completely stored in the memory cell array;
- reading a plurality of first and second read data corresponding to the plurality of first and second write data from the memory cell array at the same time, and loading the first and second read data into the first ad second data lines;
- loading the plurality of first read data loaded in the plurality of first data lines into the plurality of third data lines, and loading the plurality of second read data loaded in the plurality of second data lines into the plurality of fourth data lines; and
- compressing the plurality of first and second read data loaded in the plurality of third and fourth data lines and outputting the compressed data to the outside.

12. The method of claim 11, wherein the compressing of the plurality of first and second read data comprises:
- non-inverting or inverting the plurality of first read data loaded in the plurality of third data lines according to a read test mode signal; and
- performing a logic operation on the plurality of inverted or non-inverted first read data and the plurality of second read data loaded in the plurality of fourth data lines, and outputting the compressed data corresponding to the logic operation result to the outside.

13. The method of claim 12, wherein the non-inverting or inverting of the plurality of first read data comprises non-inverting the plurality of first read data when the first and second write data are written at the same logic level.

14. The method of claim 12, wherein the non-inverting or inverting of the plurality of first read data comprises inverting the plurality of first read data when the first and second write data are written at different logic levels.

15. A method of testing a semiconductor memory device, comprising:
- entering a parallel test mode;
- sequentially transmitting a plurality of write data through a plurality of write paths, respectively, and storing the write data in a memory cell array, based on a first data width option mode;
- reading a plurality of read data corresponding to the write data stored in the memory cell array through a plurality of read paths corresponding to the respective write paths at the same time based on a second data width option mode; and
- compressing the plurality of read data, and outputting the compressed data to the outside.

16. The method of claim 15, wherein the second data width option mode comprises a mode having a maxim data width among a plurality of data width option modes supported by the semiconductor memory device, and
- the first data width option mode comprises a mode having a data width set to less than a half of the maximum data width.

17. The method of claim 15, further comprising determining whether or not to invert given read data based on logic levels of the plurality of read data, before the reading of the plurality of read data, and
- wherein the outputting of the compressed data to the outside comprises inverting or non-inverting the given read data among the plurality of read data based on the result of the determining of whether or not to invert the given read data; and
- compressing the inverted or non-inverted read data and the other read data among the plurality of read data.

* * * * *